(12) United States Patent
Lin et al.

(10) Patent No.: US 12,334,891 B2
(45) Date of Patent: Jun. 17, 2025

(54) MODULATION DEVICE

(71) Applicant: Innolux Corporation, Miaoli County (TW)

(72) Inventors: Yi-Hung Lin, Miaoli County (TW); Kung-Chen Kuo, Miaoli County (TW); Yu-Chia Huang, Miaoli County (TW); Nai-Fang Hsu, Miaoli County (TW)

(73) Assignee: Innolux Corporation, Miaoli County (TW)

( * ) Notice: Subject to any disclaimer, the term of this patent is extended or adjusted under 35 U.S.C. 154(b) by 54 days.

(21) Appl. No.: 18/458,987

(22) Filed: Aug. 30, 2023

(65) Prior Publication Data

US 2024/0113695 A1 Apr. 4, 2024

Related U.S. Application Data

(60) Provisional application No. 63/411,635, filed on Sep. 30, 2022.

(30) Foreign Application Priority Data

Jul. 14, 2023 (CN) .......................... 202310867289.6

(51) Int. Cl.
*H03H 11/02* (2006.01)
(52) U.S. Cl.
CPC .................................. *H03H 11/02* (2013.01)

(58) Field of Classification Search
CPC ........................................................ H03H 11/02
USPC ................. 327/100, 108, 109, 110, 111, 170
See application file for complete search history.

(56) References Cited

U.S. PATENT DOCUMENTS

| | | | | |
|---|---|---|---|---|
| 2007/0046611 A1* | 3/2007 | Routley | ............... | G09G 3/3216 345/98 |
| 2008/0252356 A1* | 10/2008 | Oike | ....................... | H03K 19/01 327/374 |
| 2008/0291189 A1* | 11/2008 | Song | ..................... | G09G 3/3614 345/209 |
| 2015/0179133 A1* | 6/2015 | Lee | ........................ | G06F 3/0443 345/174 |
| 2022/0208052 A1* | 6/2022 | Jang | ......................... | G09G 3/20 |

\* cited by examiner

*Primary Examiner* — William Hernandez
(74) *Attorney, Agent, or Firm* — JCIPRNET

(57) ABSTRACT

A modulation device including a plurality of electronic elements, at least one first signal line and a first driving circuit is provided. The at least one first signal line is respectively electrically connected to at least one of the electronic elements. The first driving circuit is electrically connected to the at least one first signal line. The first driving circuit provides a first signal to at least one of the at least one first signal line. The first signal includes a first pulse. The first pulse includes a first section and a second section closely adjacent to the first section.

13 Claims, 6 Drawing Sheets

MODULATION DEVICE

CROSS-REFERENCE TO RELATED APPLICATION

This application claims the priority benefit of U.S. provisional application Ser. No. 63/411,635, filed on Sep. 30, 2022 and China application serial no. 202310867289.6, filed on Jul. 14, 2023. The entirety of each of the above-mentioned patent applications is hereby incorporated by reference herein and made a part of this specification.

BACKGROUND

Technical Field

The disclosure relates to an electronic device, and particularly relates to a modulation device.

Description of Related Art

Generally, modulation device includes multiple electronic elements. The modulation device may use signals to adjust parameters (such as a resistance value, a capacitance value or an inductance value) of the electronic elements to modulate an external signal received by the modulation device.

However, a signal line of the modulation device has a parasitic capacitance and a parasitic resistance. A signal transmitted on the signal line may be delayed according to the parasitic capacitance and parasitic resistance. This makes waveforms of the signals at different positions on the signal line different from each other. Once the difference of the waveforms increases, operations of the electronic elements at different positions on the same signal line will be inconsistent. This degrades operation uniformity of the electronic elements.

SUMMARY

The disclosure is directed to a modulation device, which is adapted to improve operation uniformity of multiple electronic elements in the modulation device.

According to an embodiment of the disclosure, the modulation device includes multiple electronic elements, at least one first signal line and a first driving circuit. The at least one first signal line is respectively electrically connected to at least one of the electronic elements. The first driving circuit is electrically connected to the at least one first signal line. The first driving circuit provides a first signal to at least one of the at least one first signal line. The first signal includes a first pulse. The first pulse includes a first section and a second section closely adjacent to the first section.

Based on the above, the first pulse includes a first section and a second section. The first driving circuit may adjust the second section of the first pulse according to a delay condition of the first signal on the first signal line. In this way, the operation uniformity of the electronic elements is improved.

DESCRIPTION OF THE EMBODIMENTS

Figure 1:
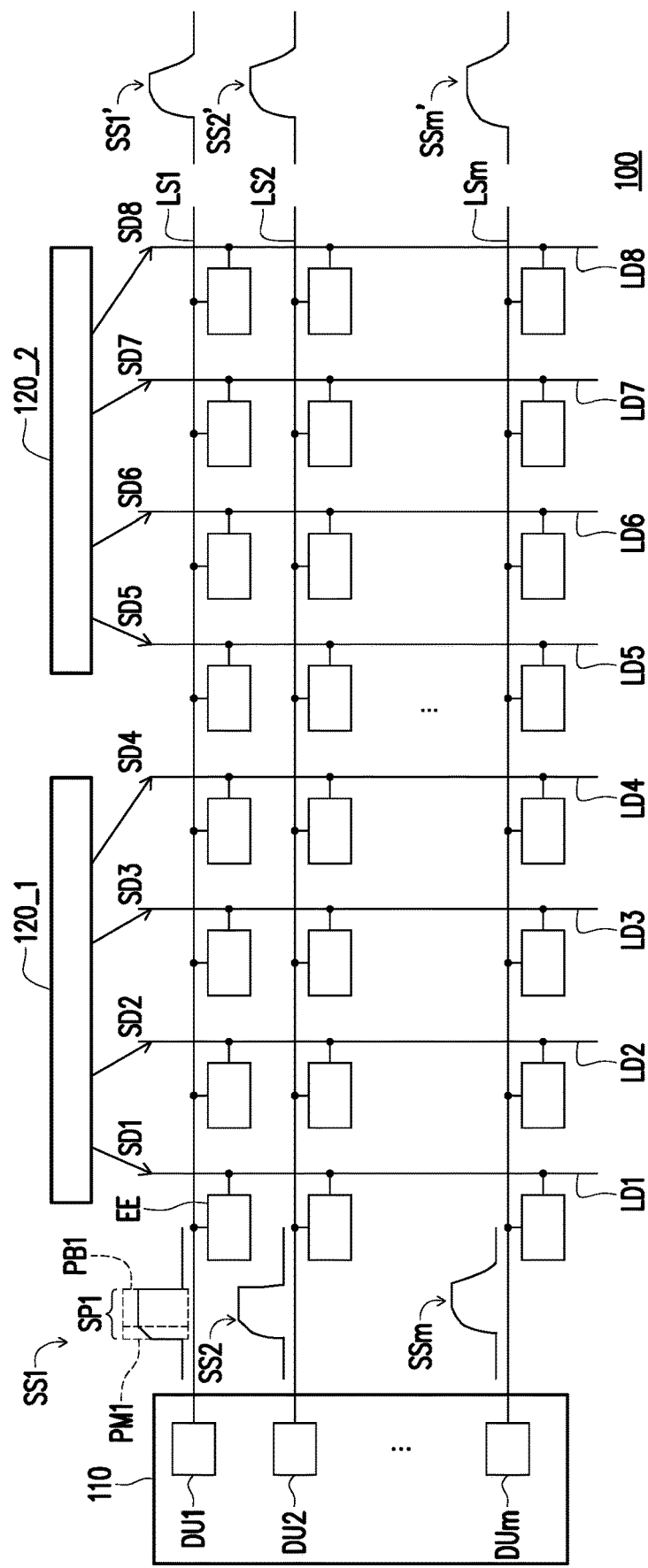
FIG. 1 is a schematic diagram of a modulation device according to a first embodiment of the disclosure.

The disclosure may be understood from the following detailed description made with reference to the drawings as described below. It should be noted that, for purposes of clarity and easy understanding by readers, each drawing of the disclosure depicts a part of an electronic device, and some components in each drawing may not be drawn to scale. In addition, the number and size of each device depicted in the drawings are illustrative only and not intended to limit the scope of the disclosure.

Certain terms are used throughout the description and the following claims to refer to specific components. As will be understood by those skilled in the art, manufacturers of electronic equipment may refer to components by different names. This specification does not intend to distinguish between components that differ in name but not function. In the following description and in the claims, the terms "containing", "including" and "having" are used in an open manner and should therefore be construed as meaning "including but not limited to . . . " Therefore, when the terms "containing", "including", and/or "having" are used in the description of the disclosure, they specify existence of corresponding features, regions, steps, operations, and/or components, but do not exclude existence of one or more corresponding features, regions, steps, operations, and/or components.

It should be understood that when a component is referred to as being "coupled to", "connected to" or "conducted to" another component, the component may be directly connected to the other component and may directly establish an electrical connection, or there may be intermediate components there between for relaying electrical connection (indirect electrical connection). In contrast, when a component is referred to as being "directly coupled to," "directly connected to," or "directly connected to" another component, there are no intervening components present.

Although terms such as first, second, third, etc., may be used to describe various constituent components, such constituent components are not limited by these terms. The terms are used only to distinguish a constituent component from other constituent components in the specification. The claims may not use the same terms, but may use the terms first, second, third etc., with respect to a required order of the components. Therefore, in the following description, a first constituent component may be a second constituent component in the claims.

A modulation device of the disclosure may include a communication device, an antenna device, a sensing device, and a light emitting device, but the disclosure is not limited thereto. Modulation devices may include bendable or flexible devices. The antenna device may be, for example, a phase modulation antenna or a liquid crystal antenna, but the disclosure is not limited thereto. The antenna device may include, for example, an antenna splicing device, but the disclosure is not limited thereto. It should be noted that the modulation device may be any permutation and combination of the aforementioned devices, but the disclosure not limited thereto. In addition, the modulation device may have a rectangular shape, a circular shape, a polygonal shape, a shape with curved edges, or other suitable shapes. The modulation device may have peripheral systems such as a driving system, a control system, a light source system, etc., but the disclosure is not limited thereto. The sensing device may include a camera, an infrared sensor or a fingerprint sensor, etc., but the disclosure is not limited thereto. In some embodiments, the sensing device may further include a flash lamp, an infrared (IR) light source, other sensors, electronic elements, or a combination thereof, but the disclosure is not limited thereto.

In the disclosure, the embodiments use "pixel" or "pixel unit" as a unit for describing a specific region including at least one functional circuit for at least one specific function. A region of a "pixel" depends on the unit used to provide a particular function, and adjacent pixels may share the same parts or wires, but may also contain specific parts of themselves therein. For example, the adjacent pixels may share the same scan line or the same data line, but a pixel may also have its own transistors or capacitors.

It should be noted that technical features in different embodiments described below may be replaced, reorganized or mixed with each other to form another embodiment without departing from the spirit of the disclosure.

Referring to FIG. 1, FIG. 1 is a schematic diagram of a modulation device according to a first embodiment of the disclosure. In the embodiment, the modulation device 100 includes multiple electronic elements EE, first signal lines LS1-LSm, and a first driving circuit 110. The first signal lines LS1-LSm are electrically connected to at least one of the electronic elements EE respectively. Taking the embodiment as an example, the first signal line LS1 is electrically connected to the electronic elements EE in a first row. The first signal line LS2 is electrically connected to the electronic elements EE located in a second row. Deduced by analogy, the first signal line LSm is electrically connected to the electronic elements EE in an $m^{th}$ row.

In some embodiments, the first signal line LS1 is electrically connected to the electronic elements EE in the first row and the electronic elements EE in the second row. In some embodiments, the first signal line LS1 is electrically connected to a part of the electronic elements EE in the first row. The disclosure is not limited to the connection method between the first signal lines LS1-LSm and the electronic elements EE in the embodiment.

In the embodiment, the first driving circuit 110 is electrically connected to the first signal lines LS1-LSm. The first driving circuit 110 provides first signals SS1-SSm to at least one of the first signal lines LS1-LSm. Taking the embodiment as an example, the first driving circuit 110 provides the first signal SS1 to the first signal line LS1. The first driving circuit 110 provides the first signal SS2 to the first signal line LS2, and so on.

Taking the first signal SS1 as an example, the first signal SS1 includes a first pulse SP1. The first pulse SP1 includes a first section PB1 and a second section PM1. The second section PM1 is closely adjacent to the first section PB1. In the embodiment, the first section PB1 has a fixed bias value. A waveform of the second section PM1 may be adjusted. Therefore, in the first pulse SP1, a waveform of the first section PB1 is different from the waveform of the second section PM1.

It should be noted here that the first pulse SP1 includes the first section PB1 and the second section PM1. The waveform of the second section PM1 may be adjusted. The first driving circuit 110 may adjust the second section PM1 of the first pulse SS1 according to a delay condition of the first signal SS1 on the first signal line LS1. A waveform difference between the first signal SS1 provided by the first driving circuit 110 and a delayed first signal SS1' on the first signal line LS1 may be reduced. In this way, operation uniformity of the electronic elements EE of the modulation device 100 may be improved.

Taking the embodiment as an example, the first driving circuit 110 includes driving units DU1-DUm. The driving units DU1-DUm are correspondingly connected to the first signal lines LS1-LSm in a one-to-one manner. Taking the embodiment as an example, the driving unit DU1 is electrically connected to a first end of the first signal line LS1. The driving unit DU2 is electrically connected to a first end of the first signal line LS2, and so on. However, the disclosure is not limited thereto. In some embodiments, the driving units DU1-DUm are directly connected to the first signal lines LS1-LSm in the one-to-one manner. In some embodiments, the driving units DU1-Dum are respectively connected to the corresponding first signal lines through an intermediate element. In some embodiments, the driving units DU1-DUm are respectively connected directly or indirectly to at least one first signal line.

An $(n)^{th}$ stage driving unit among the driving units DU1-DUm provides an (n)t h stage first signal. An $(n+1)^{th}$ stage driving unit among the driving units DU1-DUm provides an $(n+1)^{th}$ stage first signal according to the $(n)^{th}$ stage first signal, where n is a positive integer. Taking n=1 as an example, the driving unit DU1 provides the first signal SS1. The driving unit DU2 provides the first signal SS2 according to the first signal SS1. In the embodiment, the first driving circuit 110 is, for example, a shift register circuit. In other embodiments, the first driving circuit 110 may also be a bias voltage driver or other circuits that provide driving signals.

In the embodiment, the equivalent resistances and equivalent capacitances on the first signal lines LS1-LSm may be learned. Therefore, delay conditions of the first signals SS1-SSm on the first signal lines LS1-LSm may be predicted. In the embodiment, the first driving circuit 110 adjusts the waveform of the second section PM1 of the first pulse SS1 according to the delay conditions of the first signals SS1-SSm on the first signal lines LS1-LSm. In some embodiments, the first driving circuit 110 may also receive the delayed first signals according to the settings of the first signal lines LS1-LSm, and adjust the waveform of the second section PM1 according to the waveforms of the delayed first signal SS1'-SSm'. For example, in the embodiment, delay of the delayed first signal SSm' at a second end of the first signal line LSm (or at a tail end of the first signal line LSm) is the most severe. The first driving circuit 110 adjusts the waveform of the second section PM1 of the first pulse SS1 according to the waveform of the delayed first signal SSm'.

For example, the second section PM1 is ahead of the first section PB1. The first driving circuit 110 adjusts the waveform of the second section PM1 of the first pulse SS1 according to a rising time of the delayed first signal SSm'. For example, the rising time of the delayed first signal SSm' may be a time length during which a voltage value of the delayed first signal SSm' rises from 10% of a target voltage (for example, the bias value of the first section PB1) to 90% of the target voltage. The waveform of the second section PM1 has multiple different voltage rising slopes or voltage rising speeds. The waveform of the second section PM1 is similar to the waveform of the rising time of the first signal SSm'. Therefore, even if the first signal SSm' is delayed, a trend of the waveform of the rising time of the delayed first signal SSm' is still similar to the waveform of the second section PM1 of the first signal SS1. The waveform difference between the first signal SS1 and the delayed first signal SSm' may be reduced.

In the embodiment, the modulation device 100 further includes multiple second signal lines LD1-LD8 and second driving circuits 120_1 and 120_2. The second signal lines LD1-LD8 are respectively electrically connected to at least one of the electronic elements EE. The second driving circuits 120_1 and 120_2 are electrically connected to the second signal lines LD1-LD8 respectively. The second driving circuits 120_1 and 120_2 respectively provide second signals to at least one of the at least one second signal lines LD1-LD8.

Taking the embodiment as an example, the second signal line LD1 is electrically connected to the electronic elements EE in a first column. The second signal line LD2 is electrically connected to the electronic elements EE in a second column, and so on. The second driving circuit 120_1 is electrically connected to the second signal lines LD1-LD4. The second driving circuit 120_1 provides a second signal SD1 to the second signal line LD1. The second driving circuit 120_1 generates second signals SD1-SD4. The second driving circuit 120_1 provides the second signal SD2 to the second signal line LD2, and so on. The second driving circuit 120_2 is electrically connected to the second signal lines LD5-LD8. The second driving circuit 120_2 generates second signals SD5-SD8. The second driving circuit 120_2 provides the second signal SD5 to the second signal line LD5. The second driving circuit 120_2 provides the second signal SD6 to the second signal line LD6, and so on.

In the embodiment, the first signals SS1-SSm may be scan signals. The second signals SD1-SD8 may be data signals. Taking the electronic element EE connected to the first signal line LS1 and the second signal line LD1 as an example, the electronic element EE may be selected according to the first pulse SP1 of the first signal SS1, and a parameter of the electronic element EE is adjusted according to a voltage or current value of the second signal SD1. The parameter is, for example, a resistance value, a capacitance value or an inductance value. The electronic element EE is, for example, a variable resistor, a variable capacitor or a variable inductor.

In the embodiment, m first signal lines LS1-LSm and eight second signal lines LD1-LD8 are taken as an example for description. However, the disclosure is not limited to the numbers of the signal lines. The number of the first signal lines and the number of the second signal lines in the disclosure may be one or plural respectively. In addition, the number of the first driving circuit and the number of the second driving circuit in the disclosure may be one or plural.

In the embodiment, the first pulse SP1 is a positive pulse. In some embodiments, the first pulse SP1 may be a negative pulse.

Figure 2:
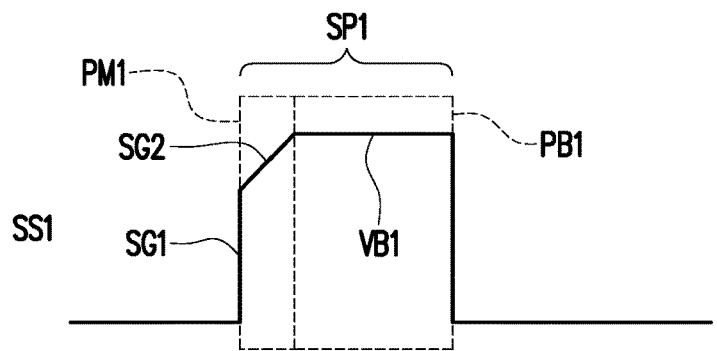
FIG. 2 is a waveform diagram of a first signal according to an embodiment of the disclosure.
Figure 2:
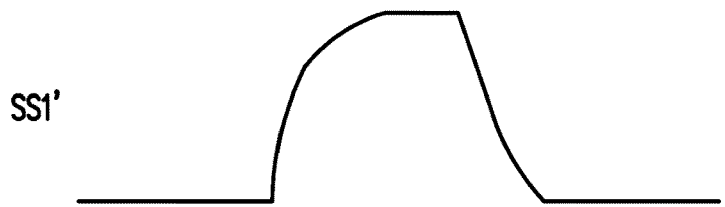

Referring to FIG. 1 and FIG. 2 at the same time, FIG. 2 is a waveform diagram of a first signal according to an embodiment of the disclosure. In the embodiment, FIG. 2 shows a waveform of the first signal SS1 and a waveform of the delayed first signal SS1'. In the embodiment, in the first signal SS1, the first pulse SP1 includes a first section PB1 and a second section PM1. The second section PM1 is ahead of the first section PB1. A voltage value of the first section PB1 is a fixed first bias value VB1. Furthermore, the waveform of the second section PM1 has different voltage rising portions SG1, SG2.

In the embodiment, the first driving circuit 110 adjusts the waveform of the second section PM1 of the first pulse SP1 according to the waveform of the delayed first signal SS1'. The waveform of the first section PB1 is different from the waveform of the second section PM1. For example, the first driving circuit 110 may adjust the voltage rising portions SG1, SG2 so that the second section PM1 fits the rising time of the first signal SS1'. For example, a voltage rising amount of the voltage rising portion SG1 is larger than a voltage rising amount of the voltage rising portion SG2.

In the embodiment, the waveform of the second section PM1 has the two voltage rising portions SG1, SG2. However, the disclosure is not limited thereto. The number of voltage rising portions of the second section PM1 of the disclosure may be plural.

In some embodiments, the first driving circuit 110 adjusts the waveform of the second section PM1 of the first pulse SP1 according to a rising time of one of the delayed first signals SS2'-SSm'.

Figure 3:
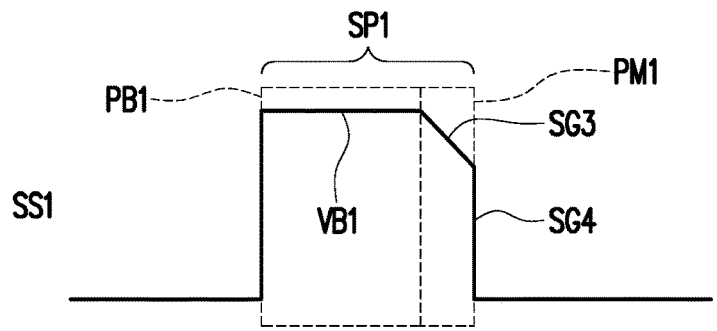
FIG. 3 is a waveform diagram of a first signal according to an embodiment of the disclosure.
Figure 3:
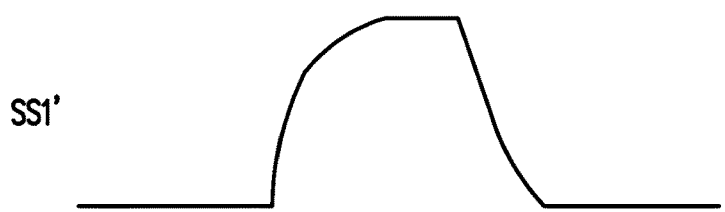

Referring to FIG. 1 and FIG. 3 at the same time, FIG. 3 is a waveform diagram of a first signal according to an embodiment of the disclosure. In the embodiment, FIG. 3 shows the waveform of the first signal SS1 and the waveform of the delayed first signal SS1'. In the embodiment, in the first signal SS1, the first pulse SP1 includes a first section PB1 and a second section PM1. The waveform of the first section PB1 is different from the waveform of the second section PM1. The second section PM1 is behind the first section PB1. A voltage value of the first section PB1 is the fixed first bias value VB1. Furthermore, the waveform of the second section PM1 has different voltage falling portions SG3, SG4.

In the embodiment, the first driving circuit 110 may adjust the voltage falling portions SG3, SG4 so that the second section PM1 fits a falling time of the first signal SS1'. For example, the voltage falling portion SG3 is larger than the voltage falling portion SG4.

In the embodiment, the waveform of the second section PM1 has two voltage falling portions SG3, SG4. However, the disclosure is not limited thereto. The number of voltage falling portions of the second section PM1 of the disclosure may be plural.

In some embodiments, the first driving circuit 110 adjusts the waveform of the second section PM1 of the first pulse SP1 according to a falling time of one of the delayed first signals SS1'-SSm'. For example, the falling time may be a time length during which the voltage value of the delayed first signal falls from 90% of a target voltage to 10% of the target voltage.

Figure 4:
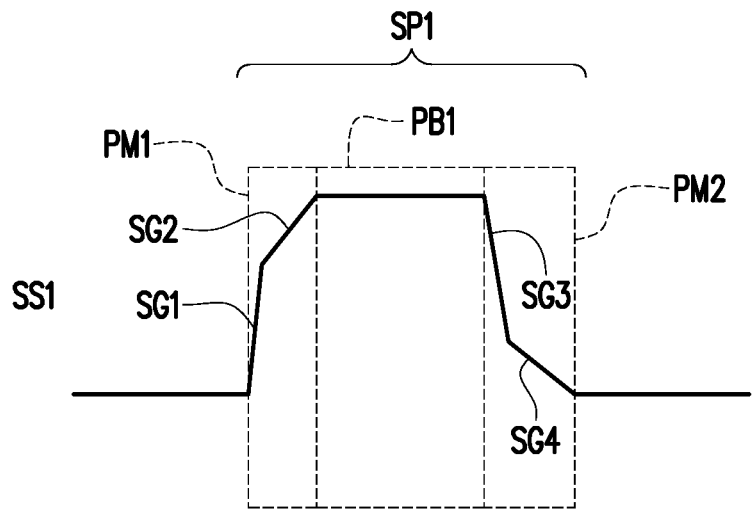
FIG. 4 is a waveform diagram of a first signal according to an embodiment of the disclosure.

Referring to FIG. 4, FIG. 4 is a waveform diagram of a first signal according to an embodiment of the disclosure. In the embodiment, in the first signal SS1, the first pulse SP1 includes a first section PB1 and second sections PM1, PM2. The second section PM1 is ahead of the first section PB1. The second section PM2 is behind the first section PB1. A waveform of the second section PM1 has voltage rising portions SG1, SG2. A waveform of the second section PM2 has voltage falling portions SG3, SG4. Implementation of the voltage rising portions SG1 and SG2 and implementation of the voltage falling portions SG3 and SG4 have been clearly described in the embodiments of FIG. 2 and FIG. 3, so they will not be repeated here.

Figure 5:
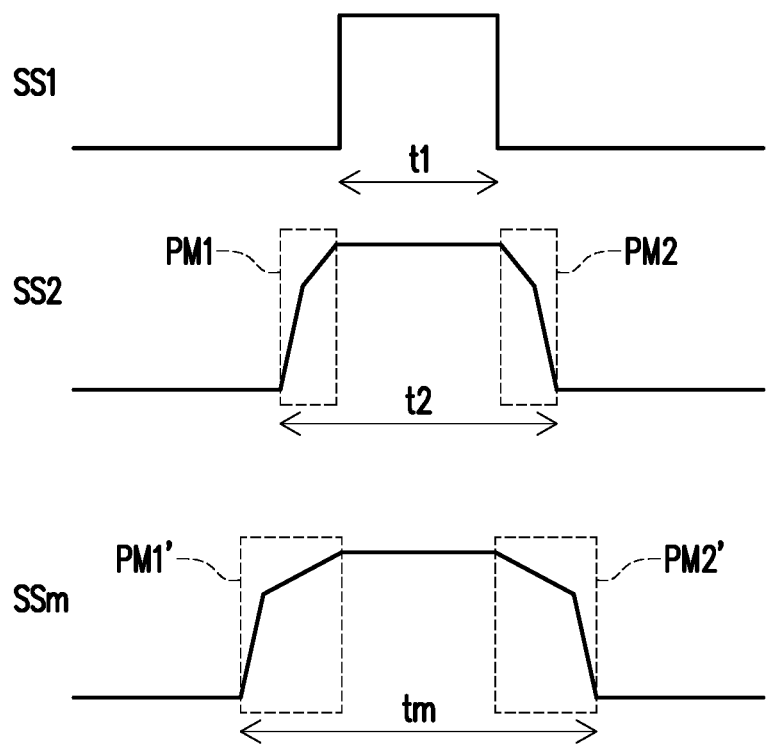
FIG. 5 is waveforms diagram of first signals according to an embodiment of the disclosure.

Referring to FIG. 1 and FIG. 5 at the same time, FIG. 5 is waveforms diagram of first signals according to an embodiment of the disclosure. FIG. 5 shows waveforms of the first signals SS1, SS2, SSm. Compared to the first pulse of the first signal SS1, a first pulse of the first signal SS2 includes second sections PM1, PM2. A width t2 of the first pulse of the first signal SS2 is greater than a width t1 of the first pulse of the first signal SS1. Therefore, the second section PM1 is used to increase a charging time of the first signal line LS2. In addition, the second section PM2 is used to fit the falling time of the delayed first signal SS2'.

Compared to the first pulse of the first signal SS1, a first pulse of the first signal SSm comprises second sections PM1', PM2'. A width tm of the first pulse of the first signal SSm is greater than the width t2 of the first pulse of the first signal SS2. Therefore, the second section PM1' is used to increase a charging time of the first signal line LSm. In addition, the second section PM2' is used to fit the falling time of the delayed first signal SSm'.

Figure 6:
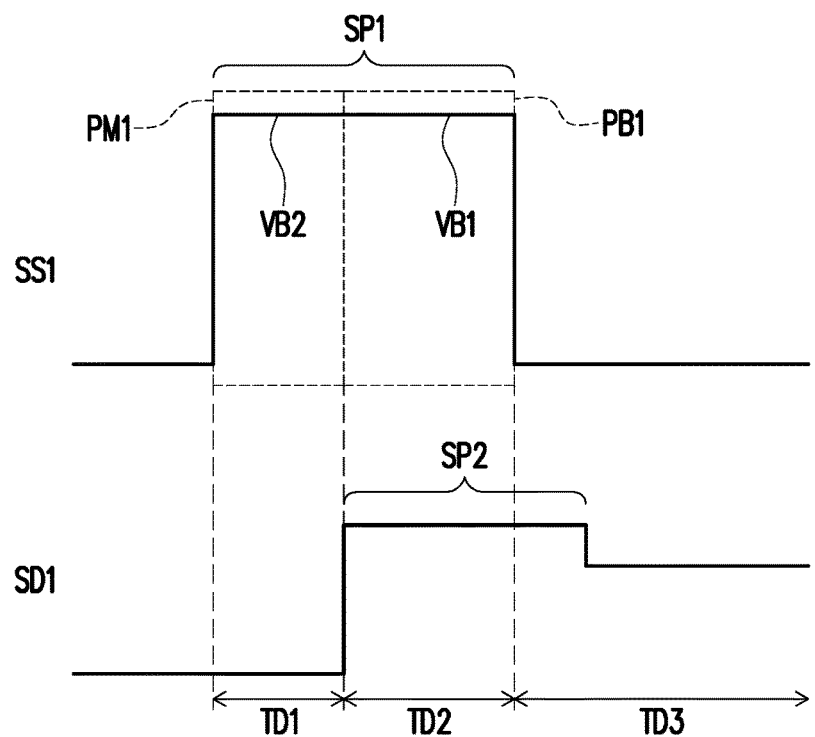
FIG. 6 is a timing diagram of a first signal and a second signal according to an embodiment of the disclosure.

Referring to FIG. 1 and FIG. 6 at the same time, FIG. 6 is a timing diagram of a first signal and a second signal according to an embodiment of the disclosure. FIG. 6 shows a waveform of the first signal SS1 and a waveform of the second signal SD1. In the embodiment, the first signal SS1 includes a first pulse SP1. The first pulse SP1 includes a first section PB1 and a second section PM1. A voltage value of the first section PB1 is a fixed first bias value VB1. The second section PM1 is closely adjacent to and ahead of the first section PB1. Therefore, the second section PM1 is a pre-charging section TD1.

The second signal SD1 includes a second pulse SP2. Taking the electronic component EE receiving the first signal SS1 and the second signal SD1 as an example, the second section PM1 of the first signal SS1 received by the electronic component EE is ahead of the second pulse SP2 received by the electronic component EE. Furthermore, the first section PB1 of the first signal SS1 received by the electronic component EE at least partially overlaps with the second pulse SP2 received by the electronic component EE. In the embodiment, the section where the first section PB1 overlaps with the second pulse SP2 received by the electronic element EE is an operation section TD2. The section where the first section PB1 does not overlap with the second pulse SP2 is a maintaining section TD3.

In the embodiment, an occurrence time point of a rising time of the second pulse SP2 is substantially equal to a start time point of the first section PB1. An occurrence time point of a falling time of the second pulse SP2 is later than an end time point of the first section PB1. However, this disclosure is not limited thereto. In some embodiments, the occurrence time point of the rising time of the second pulse SP2 is later than the start time point of the first section PB1. In some embodiments, the occurrence time point of the rising time of the second pulse SP2 is later than the start time point of the first section PB1. The occurrence time point of the falling time of the second pulse SP2 is earlier than the end time point of the first section PB1.

In the embodiment, the voltage value of the second section PM1 is a fixed second bias value VB2. In the embodiment, the second bias value VB2 is substantially the same as the first bias value VB1. In some embodiments, the second bias value VB2 is lower than the first bias value VB1. In some other embodiments, the second bias value VB2 is higher than the first bias value VB1.

Figure 7:
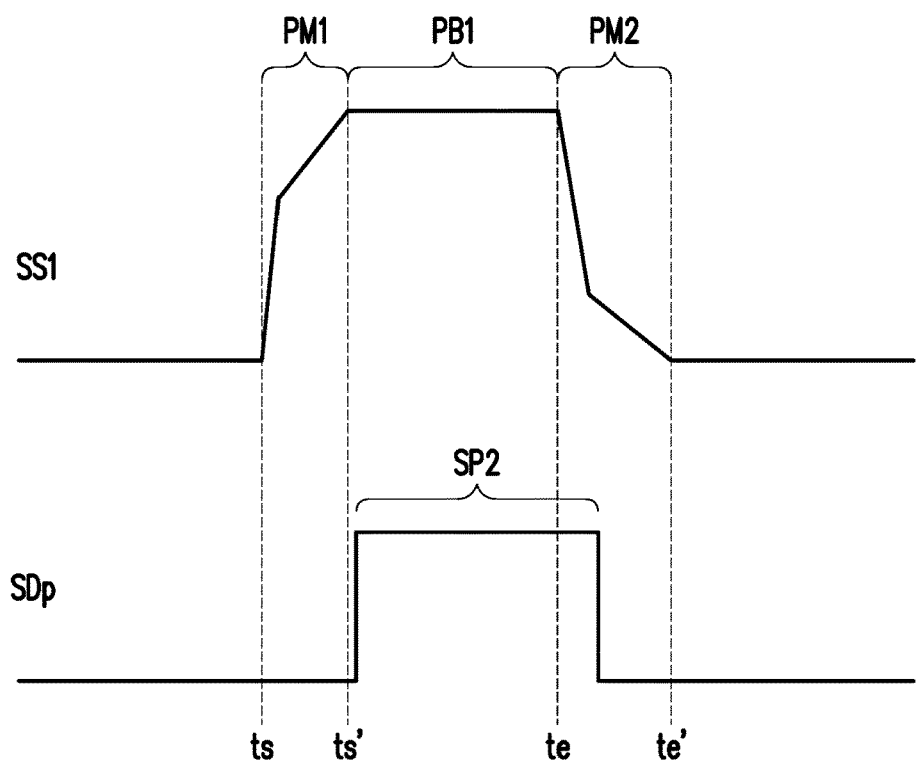
FIG. 7 is a timing diagram of a first signal and a second signal according to an embodiment of the disclosure.

Referring to FIG. 1 and FIG. 7 at the same time, FIG. 7 is a timing diagram of a first signal and a second signal according to an embodiment of the disclosure. FIG. 7 shows a waveform of the first signal SS1 and a waveform of the second signal SDp. p is greater than "1", but the disclosure is not limited thereto. In the embodiment, the first signal SS1 includes a first pulse SP1. The first pulse SP1 includes a first section PB1 and second sections PM1, PM2. A voltage value of the first section PB1 is the fixed first bias value VB1. The second section PM1 is closely adjacent to and ahead of the first section PB1. The second section PM1 is generated between a time point ts and a time point ts'. The second section PM2 is closely adjacent to and behind the first section PB1. The second signal SD1 includes a second pulse SP2. The second section PM2 is generated between a time point te and a time point te'.

Taking the electronic component EE receiving the first signal SS1 and the second signal SDp as an example, the second section PM1 of the first signal SS1 received by the electronic component EE is ahead of the second pulse SP2 received by the electronic component EE. Furthermore, the first section PB1 of the first signal SS1 received by the electronic component EE at least partially overlaps with the second pulse SP2 received by the electronic component EE. In other words, the second signal SDp is delayed and provided until the time point ts'. Therefore, a time point of the rising time of the second signal SDp is later than or equal to the time point ts'.

In addition, in the embodiment, a time point of the falling time of the second signal SDp is later than or equal to the time point te. In some embodiments, the time point of the falling time of the second signal SDp is earlier than the time point te.

In the embodiment, the second section PM1 has multiple different voltage rising portions. The second section PM2 has multiple different voltage falling portions. Implementation of the second sections PM1 and PM2 in the embodiment has been clearly illustrated in the embodiments of FIG. 2 to FIG. 4, and details thereof are not repeated here.

Figure 8:
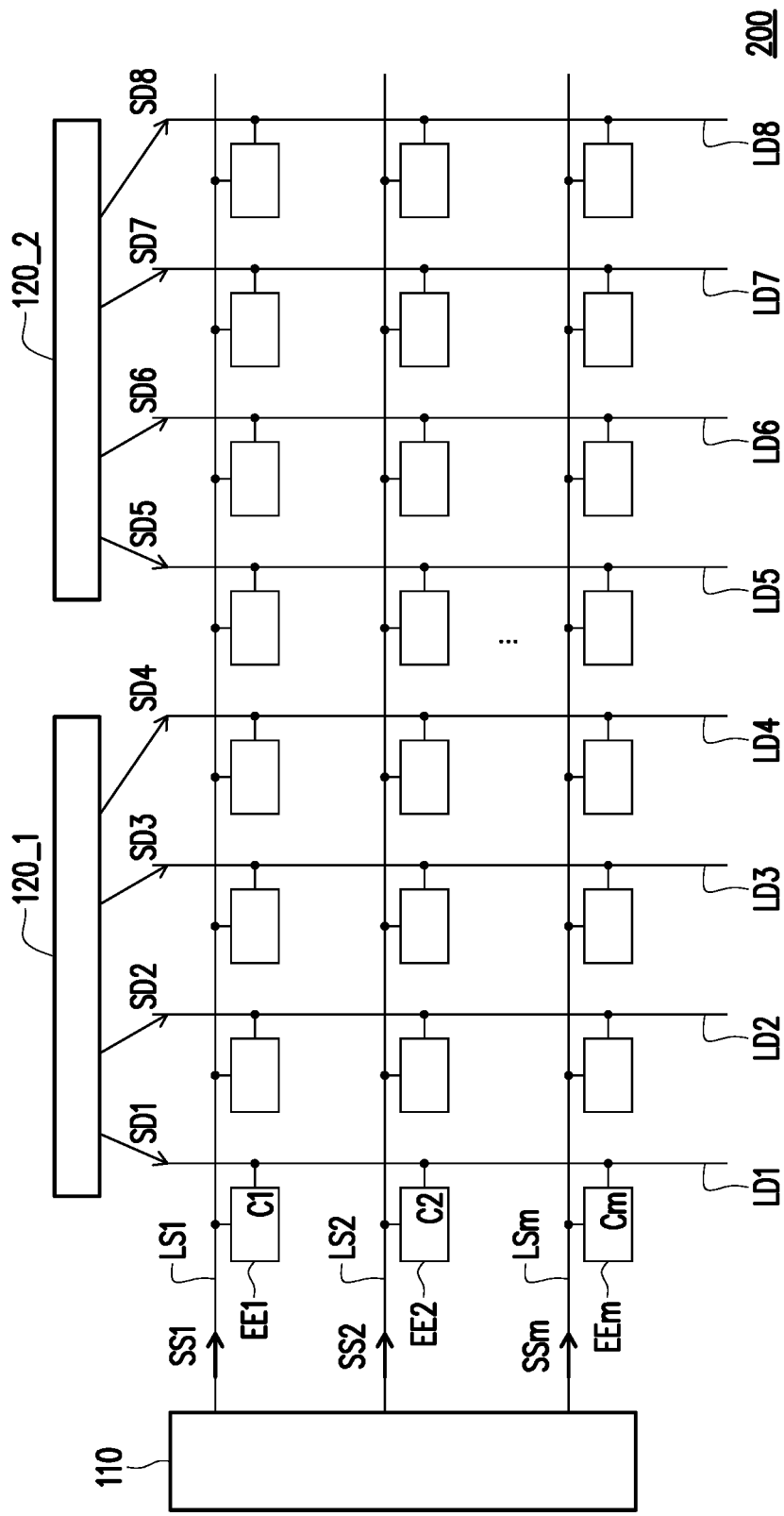
FIG. 8 a schematic diagram of a modulation device according to a second embodiment of the disclosure.

Referring to FIG. 8, FIG. 8 a schematic diagram of a modulation device according to a second embodiment of the disclosure. In the embodiment, a modulating device 200 includes multiple electronic elements, multiple first signal lines LS1-LSm, a first driving circuit 110, multiple second signal lines LD1-LD8, and second driving circuits 120_1, 120_2. Electrical connections of the electronic elements, the first signal lines LS1-LSm, the first driving circuit 110, the second signal lines LD1-LD8, and the second driving circuits 120_1, 120_2 are similar to that of the modulation device 100 shown in FIG. 1, and detail thereof is not repeated here.

In the embodiment, at least one electronic element EE1 receives a first signal SS1 (for example, an $(n)^{th}$ stage first signal). At least one electronic element EE2 receives a first signal SS2 (for example, an $(n+1)^{th}$ stage first signal). At least one electronic element EEm receives a first signal SSm (for example, the $(n+1)^{th}$ stage first signal). A first internal capacitance value C1 of the at least one electronic element EE1 receiving the first signal SS1 is greater than a second internal capacitance value C2 of the at least one electronic element EE2 receiving the first signal SS2. Therefore, the first internal capacitance value C1 may increase a capacitance value of the first signal line LS1. In this way, the capacitance value of the first signal line LS1 is close to a capacitance value of the first signal line LS2.

The first internal capacitance value C1 is, for example, an initial capacitance value or a capacitance value of a parasitic capacitor in the electronic element EE1. The second internal capacitance value C2 is, for example, an initial capacitance value or a capacitance value of a parasitic capacitor in the electronic element EE2.

In addition, the internal capacitance value Cm of the at least one electronic element EEm receiving the first signal SS1 is smaller than the second internal capacitance value C2 of the at least one electronic element EE2 receiving the first signal SS2. In this way, the capacitance value of the first signal line LS2 is close to the capacitance value of the first signal line LSm.

Figure 9:
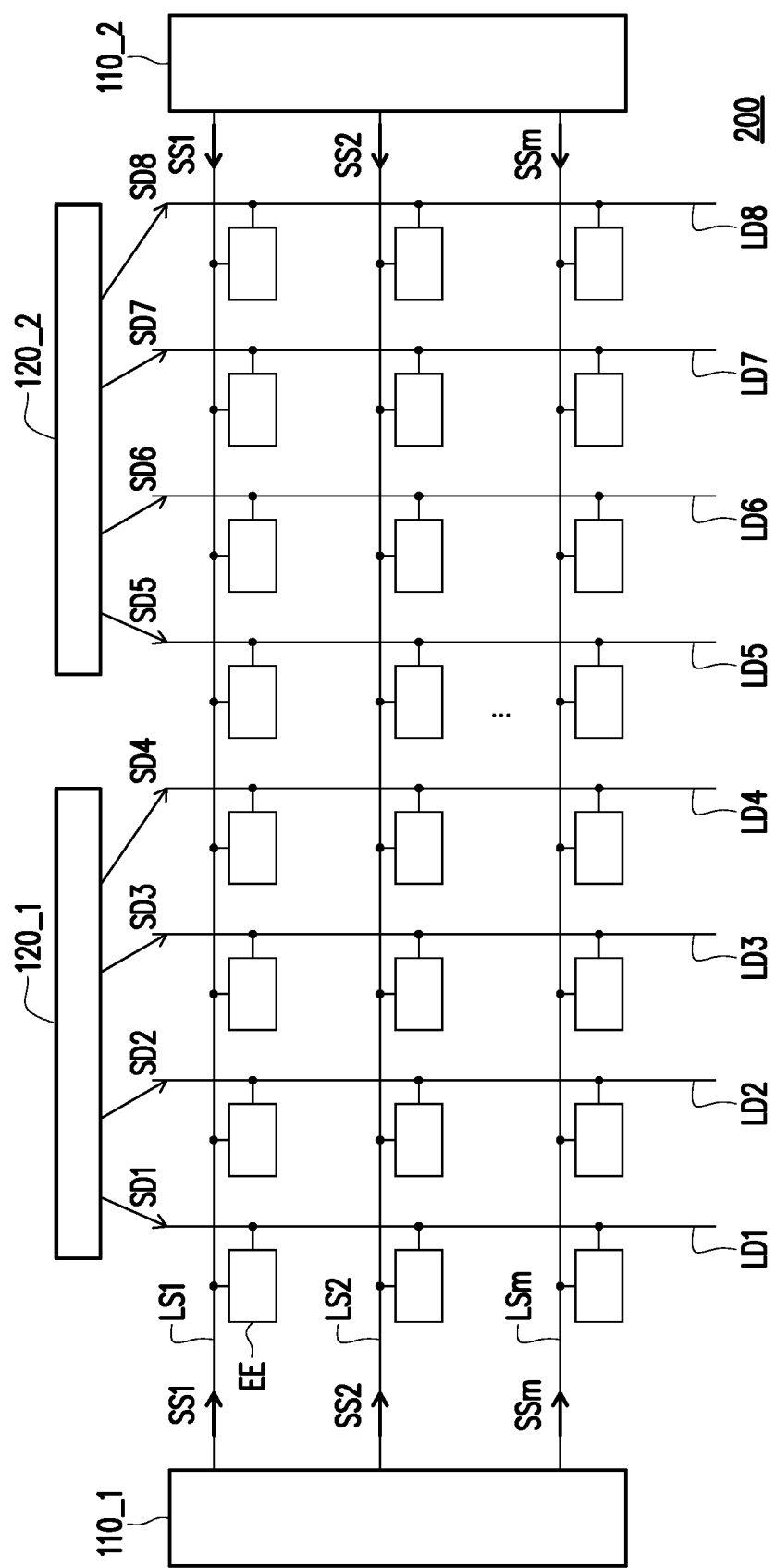
FIG. 9 is a schematic diagram of a modulation device according to a third embodiment of the disclosure.

Referring to FIG. 9, FIG. 9 is a schematic diagram of a modulation device according to a third embodiment of the disclosure. In the embodiment, a modulation device 300 includes multiple electronic elements, first signal lines LS1-LSm, first driving circuits 110_1, 110_2, second signal lines LD1-LD8, and second driving circuits 120_1, 120_2. Electrical connections of the electronic elements, the first signal lines LS1-LSm, the second signal lines LD1-LD8, and the second driving circuits 120_1, 120_2 are similar to that of the modulation device 100 shown in FIG. 1, and detail thereof is not repeated here.

Further, in the embodiment, the first driving circuits 110_1 and 110_2 provide the first signals to two ends of at least one of the first signal lines LS1-LSm. Taking the embodiment as an example, the first driving circuits 110 are electrically connected to two ends of the first signal lines LS1-LSm. The first driving circuit 110_1 provides the first signal SS1 to the first end of the first signal line LS1. The first driving circuit 110_1 provides the first signal SS2 to the first end of the first signal line LS2, and so on. The first driving circuit 110_2 provides the first signal SS1 to the second end of the first signal line LS1. The first driving circuit 110_2 provides the first signal SS2 to the second end of the first signal line LS2, and so on. In other words, the first signal SS1 is simultaneously provided to two ends of the first signal line LS1. The first signal SS2 is simultaneously provided to two ends of the first signal line LS2, and so on. In this way, the waveforms of the first signal SS1 at two ends of the first signal line LS1 are substantially similar. The waveforms of the first signal SS2 at two ends of the first signal line LS2 are substantially similar, and so on.

In summary, the first pulse includes the first section and the second section. The first driving circuit may adjust the second section of the first pulse according to a delay condition of the first signal on the first signal line. The second section is adjusted to fit the rising time of the delayed first signal and/or the falling time of the delayed first signal. A trend of the rising time and/or falling time of the delayed first signal is similar to the waveform of the second section of the first signal SS1. In this way, the operation uniformity of the electronic elements may be improved. Furthermore, the second section of the first pulse received by the electronic element is ahead of the second pulse of the second signal received by the electronic element. Therefore, the second section increases the charging time of the first signal line.

It will be apparent to those skilled in the art that various modifications and variations can be made to the disclosed embodiments without departing from the scope or spirit of the disclosure. In view of the foregoing, it is intended that the disclosure covers modifications and variations provided they fall within the scope of the following claims and their equivalents.

What is claimed is:

1. A modulation device, comprising:
   a plurality of electronic elements;
   at least one first signal line, respectively electrically connected to at least one of the electronic elements; and
   a first driving circuit, electrically connected to the at least one first signal line and configured to provide a first signal to at least one of the at least one first signal line,
   wherein the first signal comprises a first pulse,
   wherein the first pulse comprises a first section and a second section closely adjacent to the first section, and a waveform of the first section is different from a waveform of the second section, and
   wherein the second section is ahead of the first section and the second section has a plurality of different voltage rising portions.

2. The modulation device according to claim 1, wherein a voltage value of the first section is a fixed first bias value.

3. The modulation device according to claim 1, wherein the first driving circuit adjusts the voltage rising portions such that the second section fits a rising time of a delayed first signal.

4. The modulation device according to claim 1, wherein the first driving circuit comprises a plurality of driving units,
   an $(n)^{th}$ stage driving unit among the driving units provides an $(n)^{th}$ stage first signal,
   an $(n+1)^{th}$ stage driving unit among the driving units provides an $(n+1)^{th}$ stage first signal according to the $(n)^{th}$ stage first signal, and
   n is a positive integer.

5. The modulation device according to claim 4, wherein at least one first electronic element of the electronic elements receives the $(n)^{th}$ stage first signal,
   at least one second electronic element of the electronic elements receives the $(n+1)^{th}$ stage first signal, and
   a first internal capacitance value of the at least one first electronic element is greater than a second internal capacitance value of the at least one second electronic element.

6. The modulation device according to claim 1, wherein the first driving circuit adjusts a waveform of the second section of the first pulse according to a delay condition of the first signal on the at least one first signal line.

7. The modulation device according to claim 1, wherein the first signal is simultaneously provided to two ends of the at least one first signal line.

8. The modulation device according to claim 1, further comprising:
   at least one second signal line, respectively electrically connected to at least one of the electronic elements; and
   a second driving circuit, electrically connected to the at least one second signal line and configured to provide a second signal to the at least one second signal line,
   wherein the second signal comprises a second pulse.

9. The modulation device according to claim 8, wherein:
   the second section of the first signal received by a first electronic element of the electronic elements is ahead of the second pulse received by the first electronic element, and
   the first section of the first signal received by the first electronic element at least partially overlaps with the second pulse received by the first electronic element.

10. The modulation device according to claim 8, wherein:
    the second section of the first signal does not overlap with the second pulse received by the first electronic element.

11. The modulation device according to claim 10, wherein the second section is a pre-charging section of the first signal.

12. A modulation device, comprising:
a plurality of electronic elements;
at least one first signal line, respectively electrically connected to at least one of the electronic elements; and
a first driving circuit, electrically connected to the at least one first signal line and configured to provide a first signal to at least one of the at least one first signal line,
wherein the first signal comprises a first pulse,
wherein the first pulse comprises a first section and a second section closely adjacent to the first section, and a waveform of the first section is different from a waveform of the second section, and
wherein the second section is behind the first section and the second section has a plurality of different voltage falling portions.

13. A modulation device, comprising:
a plurality of electronic elements;
at least one first signal line, respectively electrically connected to at least one of the electronic elements; and
a first driving circuit, electrically connected to the at least one first signal line and configured to provide a first signal to at least one of the at least one first signal line,
wherein the first signal comprises a first pulse,
wherein the first pulse comprises a first section and a second section closely adjacent to the first section, and a waveform of the first section is different from a waveform of the second section, and
wherein the second section is ahead of the first section and a voltage value of the second section is a fixed second bias value.

* * * * *